(12) United States Patent
Zhang et al.

(10) Patent No.: US 9,054,107 B2
(45) Date of Patent: Jun. 9, 2015

(54) RELIABLE INTERCONNECT FOR SEMICONDUCTOR DEVICE

(71) Applicant: GLOBALFOUNDRIES Singapore Pte. Ltd., Singapore (SG)

(72) Inventors: Fan Zhang, Singapore (SG); Xiaomei Bu, Singapore (SG); Jane Hui, Singapore (SG); Tae Jong Lee, SeongNam (KR); Liang Choo Hsia, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/094,717

(22) Filed: Dec. 2, 2013

(65) Prior Publication Data

US 2014/0084486 A1   Mar. 27, 2014

Related U.S. Application Data

(62) Division of application No. 12/568,658, filed on Sep. 28, 2009, now Pat. No. 8,598,031.

(51) Int. Cl.

| | |
|---|---|
| *H01L 23/52* | (2006.01) |
| *H01L 23/522* | (2006.01) |
| *H01L 21/311* | (2006.01) |
| *H01L 21/321* | (2006.01) |
| *H01L 21/768* | (2006.01) |
| *H01L 23/532* | (2006.01) |

(52) U.S. Cl.
CPC ...... *H01L 23/5226* (2013.01); *H01L 21/31127* (2013.01); *H01L 21/31144* (2013.01); *H01L 21/3212* (2013.01); *H01L 21/76822* (2013.01); *H01L 21/7684* (2013.01); *H01L 21/76885* (2013.01); *H01L 23/53238* (2013.01)

(58) Field of Classification Search
USPC .................. 257/734–786, E23.01–E23.079, 257/E23.001, E23.002, E23.141–E23.178; 438/597–688
See application file for complete search history.

(56) References Cited

U.S. PATENT DOCUMENTS

| | | | | | |
|---|---|---|---|---|---|
| 5,759,906 | A | * | 6/1998 | Lou ............................... | 438/623 |
| 5,877,045 | A | * | 3/1999 | Kapoor ......................... | 438/151 |
| 6,225,240 | B1 | * | 5/2001 | You et al. ...................... | 438/782 |
| 6,317,642 | B1 | * | 11/2001 | You et al. ...................... | 700/121 |

(Continued)

OTHER PUBLICATIONS

M. B. Anand, Masaki Yamada, and Hideki Shibata, Use of Gas as Low-k Interlayer Dielectric in LSI's: Demonstration of Feasibility, IEEE Transactions on Electron Devices, Nov. 1997, pp. 1965-1971, vol. 44, No. 11, IEEE, Japan.

(Continued)

*Primary Examiner* — Fernando L Toledo
*Assistant Examiner* — Victoria K Hall
(74) *Attorney, Agent, or Firm* — Horizon IP Pte. Ltd.

(57) ABSTRACT

A method for forming a semiconductor device is presented. A substrate prepared with a dielectric layer formed thereon is provided. A sacrificial and a hard mask layer are formed on the dielectric layer. The dielectric, sacrificial and hard mask layers are patterned to form an interconnect opening. The interconnect opening is filled with a conductive material to form an interconnect. The conductive material is processed to produce a top surface of the conductive material that is substantially planar with a top surface of the sacrificial layer. The sacrificial layer is removed. The sacrificial layer protects the dielectric layer during processing of the conductive material.

20 Claims, 8 Drawing Sheets

(56) References Cited

U.S. PATENT DOCUMENTS

| | | | | |
|---|---|---|---|---|
| 6,387,825 | B2 * | 5/2002 | You et al. | 438/782 |
| 6,407,009 | B1 * | 6/2002 | You et al. | 438/782 |
| 6,432,779 | B1 | 8/2002 | Hobbs et al. | |
| 6,452,110 | B1 * | 9/2002 | Clevenger et al. | 174/257 |
| 6,530,340 | B2 * | 3/2003 | You et al. | 118/696 |
| 7,138,714 | B2 * | 11/2006 | Nguyen et al. | 257/751 |
| 7,745,282 | B2 | 6/2010 | Yang et al. | |
| 7,750,477 | B2 * | 7/2010 | Sinha | 257/774 |
| 8,927,420 | B2 * | 1/2015 | Liou et al. | 438/643 |
| 2001/0001407 | A1 * | 5/2001 | You et al. | 156/166 |
| 2001/0029111 | A1 * | 10/2001 | You et al. | 438/782 |
| 2004/0038513 | A1 | 2/2004 | Kohl et al. | |
| 2004/0130027 | A1 * | 7/2004 | Chen et al. | 257/758 |
| 2005/0266698 | A1 * | 12/2005 | Cooney et al. | 438/765 |
| 2006/0118955 | A1 * | 6/2006 | Liu | 257/753 |
| 2007/0020918 | A1 * | 1/2007 | Hirokawa et al. | 438/626 |
| 2007/0080386 | A1 | 4/2007 | Huang et al. | |
| 2008/0197499 | A1 | 8/2008 | Yang et al. | |
| 2008/0197500 | A1 * | 8/2008 | Yang et al. | 257/758 |
| 2009/0152723 | A1 * | 6/2009 | Ou et al. | 257/751 |
| 2009/0218233 | A1 | 9/2009 | Fredenberg et al. | |

OTHER PUBLICATIONS

Paul A. Kohl, Qiang Zhao, Kaushal Patel, Douglas Schmidt, Sue Ann Bidstrup-Allen, Robert Snick and S. Jayaraman, Air-Gaps for Electrical Interconnections, Electrochemical and Solid-State Letters, Jan. 30, 1998, pp. 49-51, vol. 1, The Electrochemical Society, Inc., USA.

* cited by examiner

RELIABLE INTERCONNECT FOR SEMICONDUCTOR DEVICE

CROSS-REFERENCE

This application is a divisional application which claims benefit of copending U.S. patent application Ser. No. 12/568,658, filed on Sep. 28, 2009, which is herein incorporated by reference in its entirety.

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench in an upper portion. The via serves as a contact to a device while the trench contains the conductive line for connecting the device to, for example, other devices.

As size of IC continues to shrink and with increased density features in an IC, more interconnects are required to connect the features in various levels. Different feature density and feature sizes across the IC render various topographies on the surface of the IC. The variation of topography in the dielectric layer and interconnection, for example, may affect the processing window, compromising the reliability of the IC.

From the foregoing discussion, it is desirable to provide a planarized topography for dielectric and interconnect to increase the reliability of IC.

SUMMARY

Embodiments generally relate to a semiconductor device and methods of making thereof. In one embodiment, a method for forming a semiconductor device is presented. A substrate prepared with a dielectric layer formed thereon is provided. A sacrificial and a hard mask layer are formed on the dielectric layer. The dielectric, sacrificial and hard mask layers are patterned to form an interconnect opening. The interconnect opening is filled with a conductive material to form an interconnect. The conductive material is processed to produce a top surface of the conductive material that is substantially planar with a top surface of the sacrificial layer. The sacrificial layer is removed. The sacrificial layer protects the dielectric layer during processing of the conductive material.

A method for forming a semiconductor device is disclosed in another embodiment. The method includes providing a substrate prepared with a dielectric layer, sacrificial and hard mask layer formed thereon. An interconnect opening is formed in the dielectric, sacrificial and hard mask layers. The interconnect opening is filled with a conductive material to form an interconnect. The conductive material is polished to produce a top surface of the conductive material that is substantially planar with a top surface of the sacrificial layer. The sacrificial layer is removed. The sacrificial layer protects the dielectric layer during polishing of the conductive material.

In yet another embodiment, a semiconductor device is disclosed. The semiconductor device includes a substrate and a dielectric layer on the substrate with an interconnect. When a sacrificial layer is disposed on top of the dielectric layer, the sacrificial layer protects the dielectric layer during polishing of the interconnect to produce a top surface of the dielectric layer that is substantially planar with a top surface of the interconnect. In another embodiment, the sacrificial layer protects the dielectric layer during polishing of the interconnect to maintain hydrophobic properties of the dielectric layer after polishing.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, such as semiconductor devices or ICs. Other types of devices, such as micro electro-mechanical systems (MEMS), liquid crystal displays, are also useful. The ICs can be any type of IC, for example dynamic or static random access memories, signal processors, or system-on-chip devices. The ICs can be incorporated into, for example, consumer electronic products, such as computers, cell phones, and personal digital assistants (PDAs).

Figure 1:
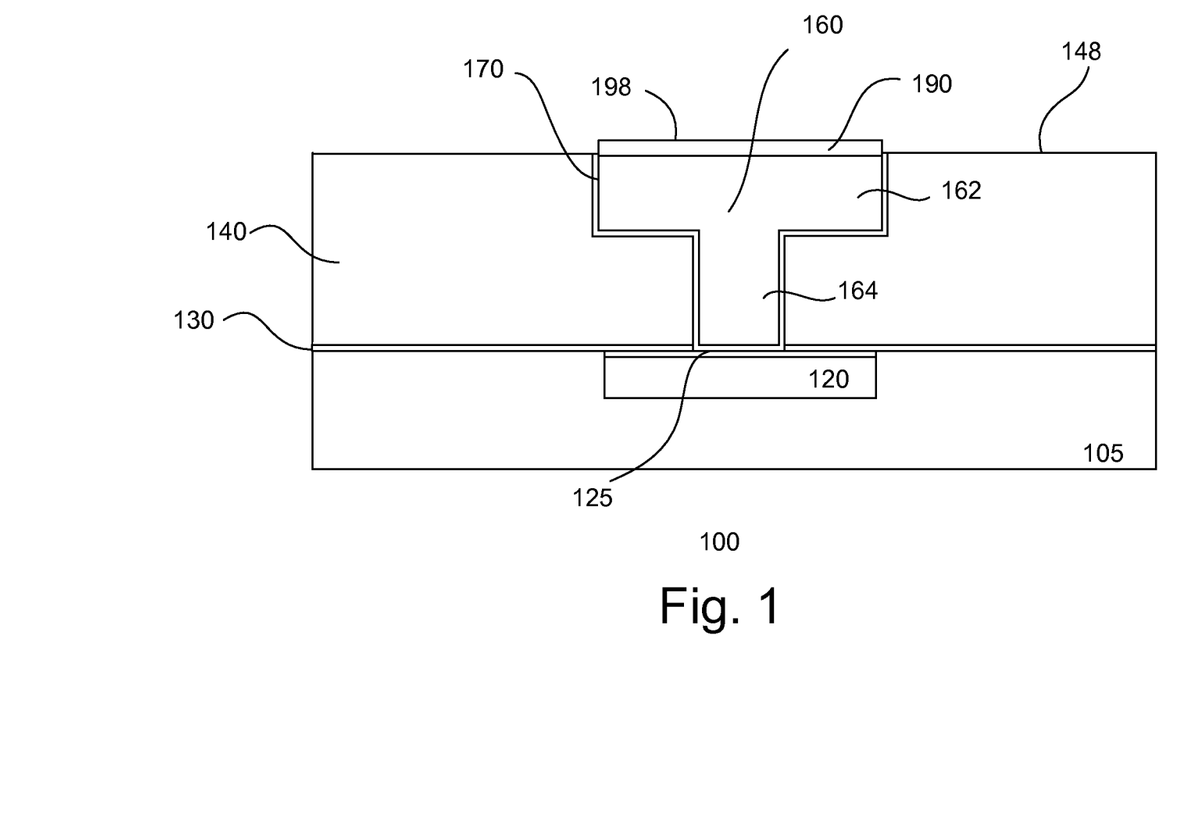
FIG. 1 shows a cross-sectional view of an embodiment of a portion of an IC.

FIG. 1 shows an embodiment of a portion of a device, such as an integrated circuit (IC) 100. Other types of devices are also useful. As shown, the portion includes a substrate 105. The substrate, for example, comprises a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

A dielectric layer 140 is disposed on the substrate. The dielectric layer, for example, serves as an interconnect dielectric (ICD) layer in which interconnects are formed. The interconnects provide the desired interconnections for the different circuit components. A lower etch stop layer 130 may be provided beneath the ICD layer. The lower etch stop layer can comprise various types of materials. In one embodiment, the lower etch stop layer comprises a dielectric material such as silicon nitride. Other types of etch stop materials can also be useful. For example, the lower etch stop layer can comprise, silicon carbide. The lower etch stop layer may also serve as a capping layer. Other types of etch stop layers are also useful. The thickness of the lower etch stop layer can be about 250-1500 Å. Other thicknesses are also useful.

The dielectric layer, in one embodiment, comprises a low-k (LK) or ultra low-k (ULK) dielectric material. Various types of low-k or ultra low-k materials, such as organo-silicate glass (OSG), fluorine-doped silicate glass (FSG) or SiCOH can be employed. Other types of dielectric materials are also useful.

For example, the dielectric layer can comprise silicon oxide, doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide.

In one embodiment, the ICD includes lower and upper portions. The lower portion serves as an inter-level dielectric (ILD) layer while the upper portion serves as an intra-metal dielectric (IMD) layer. The dielectric layer can be a single layer or multi-layered stack. For example, a single layer can be used to serve as both the ILD and IMD or separate layers are used for the ILD and IMD. For multi-layered ICD, the ILD and IMD can comprise the same or different materials. In some cases, an etch stop layer can be disposed between the ILD and IMD. The ICD layer can represent any interconnect level of the device. For example, the ICD layer can be M1, M2, etc.

In one embodiment, the ICD layer forms an interconnect level Mx, where x≥2. For example, the ICD layer forms a second interconnect level M2. For interconnect levels greater than M2, a lower ICD layer is provided to form a lower interconnect level Mx−1. An ICD layer can be provided above to form the next higher interconnect level Mx+1, unless the ICD layer is the highest interconnect level. Providing an ICD layer which is at the lowest level M1 may also be useful.

An interconnect 160 is disposed in the ICD layer. The IC can include numerous interconnects. In one embodiment, the interconnect comprises a conductive line 162 in the upper portion or IMD while a contact 164 is disposed in the lower portion or ILD. The interconnect comprises a conductive material. For example, the conductive material can be any metal or alloy. In one embodiment, the interconnect may comprise copper, aluminum, tungsten, their alloys, or a combination thereof. It is understood that the contacts and conductive line can comprise the same or different materials. The contact couples the conductive line to a contact region below. Depending on the ICD level, the contact region can be, for example, another metal line 120 or a device region, such as a diffusion region or a gate of a transistor or a plate of a capacitor.

In the case where the contact region comprises a lower conductive line, it is disposed in a lower ICD layer. The lower conductive line includes a capping layer 125 on its top surface. In one embodiment, the capping layer comprises a conductive capping layer. For example, the conductive capping layer may comprise cobalt tungsten phosphide (CoWP) or CuSiN. Other types of capping materials are also useful. The capping layer can serve to passivate the metal line.

In one embodiment, an etch stop layer 130 is disposed between the ICD layers and over the capping layer. The etch stop layer, for example, comprises a dielectric material, such as silicon nitride. Other types of materials, such as silicon carbide, may also be useful. The etch stop can also serve as a dielectric capping layer.

A barrier 170 can be provided to line the sidewalls and bottom of the interconnect. The barrier serves to protect the conductive line from diffusing into the dielectric layer. The barrier, for example, can comprise tantalum nitride (TaN), tantalum (Ta), titanium nitride (TiN) or a combination thereof. Other types of barrier material, such as ruthenium, are also useful.

The surface of the conductive line can comprise a capping layer 190. In one embodiment, the protective capping layer comprises a conductive capping layer. The conductive capping layer can be similar to the conductive capping layer of the lower conductive line. The conductive capping layer, for example, comprises CoWP. Other types of conductive capping layers are also useful. The thickness of the capping layer may be about 10-1000 Å. Providing a capping layer with other thicknesses is also useful.

The conductive line and/or contact, as shown, are provided with vertical or substantially vertical sidewalls. Alternatively, the conductive lines and/or contacts are provided with slanted sidewalls. The slanted sidewall profile can improve sidewall barrier and seed coverage during processing. The slanted sidewalls, for example, comprise an angle of about 85-89°.

In one embodiment, a top surface 148 of the ICD layer maintains its hydrophobic characteristic and is devoid of damage or defects due to polishing (defect free). During formation of interconnects, polishing or CMP process is used to remove the barrier layer, hard mask and conductive material that are external to the interconnect opening. We have discovered that the chemical or slurry used in the polishing step causes the LK or ULK dielectric material, which are relatively porous, to absorb moisture, thus making the dielectric material hydrophilic. This creates an undesirable effect as it increases the capacitance attributed to the ICD layer and damage to the ICD layer, hence resulting in degradation of time dependent dielectric breakdown (TDDB).

To maintain the hydrophobic characteristic of the ICD layer and provide a defect free surface, a sacrificial layer is employed. In one embodiment, the sacrificial layer comprises a decomposable sacrificial layer. Other types of sacrificial layers are also useful. The decomposable sacrificial layer, for example, can comprise an organic material. For example, the organic material can comprise carbon, polynorbornene or a combination thereof. The decomposable sacrificial layer is disposed on the surface of the ICD layer. To remove the sacrificial layer, a non-etch or polishing process is used. In one embodiment, the decomposable sacrificial layer is removed by heat. For example, the sacrificial layer is subjected to a decomposing anneal at a temperature equal to or greater than the decomposable threshold temperature ($T_{DTT}$). The magnitude of $T_{DTT}$ may depend on, for example, the sacrificial layer. The decomposable threshold temperature, for example, may be about 100-500° C. Other $T_{DTT}$ may also be useful. The decomposing anneal can include a non-oxidizing ambient.

In one embodiment, the top surface of the ICD layer is disposed or recessed below a top surface 198 of the protective capping layer. The height of the recess, for example, is about 50-300 Å. The recess may be due to, in one embodiment, removal of a sacrificial layer (not shown) used in the integration scheme of forming the interconnect. Providing the top surface of the ICD layer which is not recessed is also useful. For example, the top surface of the ICD layer can be coplanar or above the top surface of the capping layer.

Figure 2A:
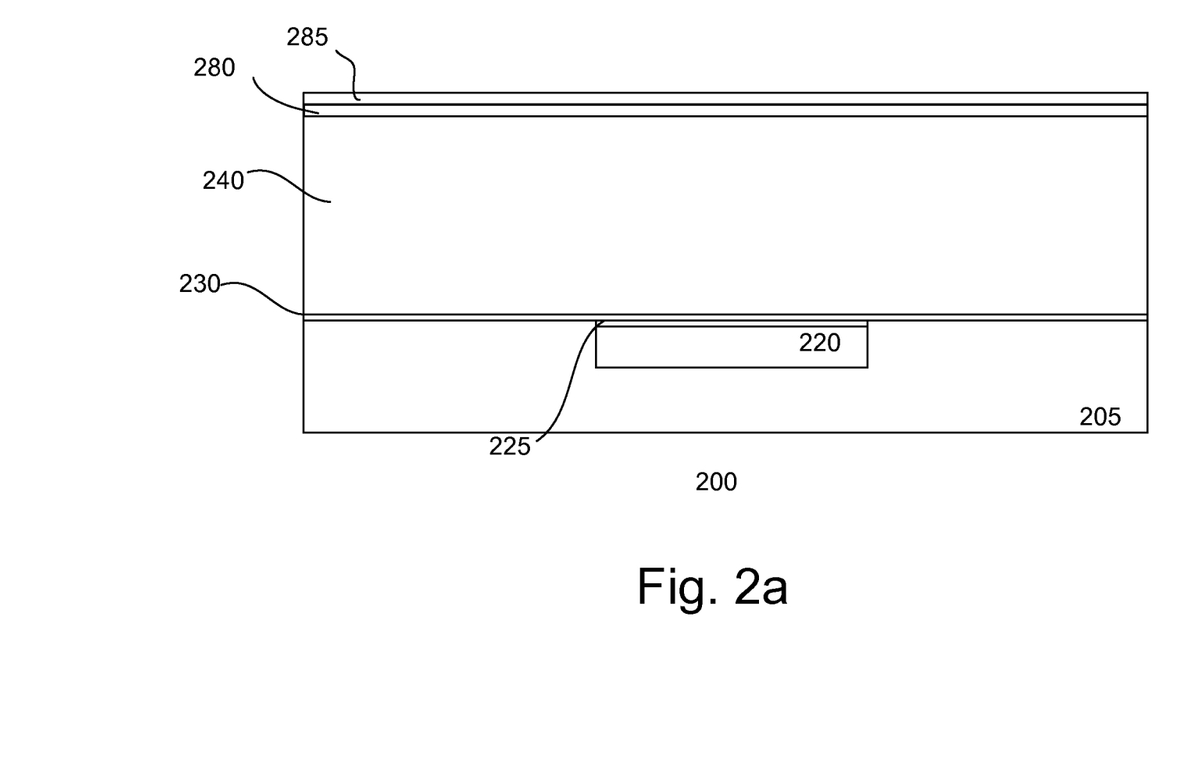
FIGS. 2a-f show an embodiment of a process for forming a portion of an IC.

FIGS. 2a-f show a process for forming a portion 200 of a device, such as an IC in accordance with one embodiment. Referring to FIG. 2a, a substrate 205 is provided. The substrate, in one embodiment, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with a dielectric layer 240. The dielectric layer, for example, serves as an ICD layer. In one embodiment, the dielectric layer comprises a low-k (LK) or ultra low-k (ULK) dielectric material. Various types of low-k or ultra low-k materials, such as organo-silicate glass (OSG), fluorine-doped silicate glass (FSG) or SiCOH, can be employed. In one embodiment, the dielectric layer can be Black Diamond, Coral or SiLK. Other types of dielectric materials are also useful. For example, the dielectric layer can comprise silicon oxide, doped silicon oxide such as fluorinated silicon oxide (FSG), undoped or doped silicate glasses such as boron phosphate silicate glass (BPSG) and phosphate silicate glass (PSG).

The ICD layer or layers can be deposited using various types of deposition techniques. For example, chemical vapor deposition (CVD) processes such as plasma enhanced (PECVD), high density (HDCVD), atmospheric pressure (APCVD) can be used. Other techniques such as spin-on processes are also useful. The specific process, for example, can depend on the type of material used and application.

The ICD layer forms an interconnect level Mx, where x=1 to n for an IC within interconnect levels. In one embodiment, the ICD layer forms an interconnect level Mx, where x≥2. For example, the ICD layer forms a second interconnect level M2. For interconnect levels greater than M2, a lower ICD layer is provided to form a lower interconnect level Mx−1. An ICD layer can be provided above to form the next higher interconnect level Mx+1, unless the ICD layer is the highest interconnect level. Providing an ICD layer which is at the lowest level M1 may also be useful.

A lower etch stop layer 230 may be provided beneath the ICD layer. The lower etch stop layer can include various types of materials. In one embodiment, the lower etch stop layer comprises a dielectric material such as silicon nitride. Other types of etch stop materials are also useful. The lower etch stop layer can comprise, for example, silicon carbide. The lower etch stop layer may also serve as a capping layer. Other types of etch stop layers are also useful.

In one embodiment, a sacrificial layer 280 is formed on the dielectric layer. The sacrificial layer, for example, comprises a decomposable sacrificial layer. In one embodiment, the decomposable sacrificial layer can be removed without polishing or etching. In one embodiment, the decomposable sacrificial layer can be removed by a decomposing anneal.

In one embodiment, the sacrificial layer comprises an organic sacrificial layer. The sacrificial layer, for example, comprises carbon, polynorbornene or a combination thereof. Other types of sacrificial materials are also useful. The sacrificial layer can be deposited by, for example, spin coating. Other deposition processes may also be useful. The thickness of the sacrificial layer may be 50-1000 Å. Other thicknesses are also useful.

In one embodiment, a hard mask layer 285, is formed over the sacrificial layer. The hard mask layer may comprise, for example, TEOS. Other types of hard mask materials are also useful. For example, the hard mask may comprise silicon nitride or silicon carbide. The thickness of the hard mask can be about 50-1000 Å. Other thicknesses are also useful. Various techniques, such as CVD, can be used to form the hard mask.

Figure 2B:
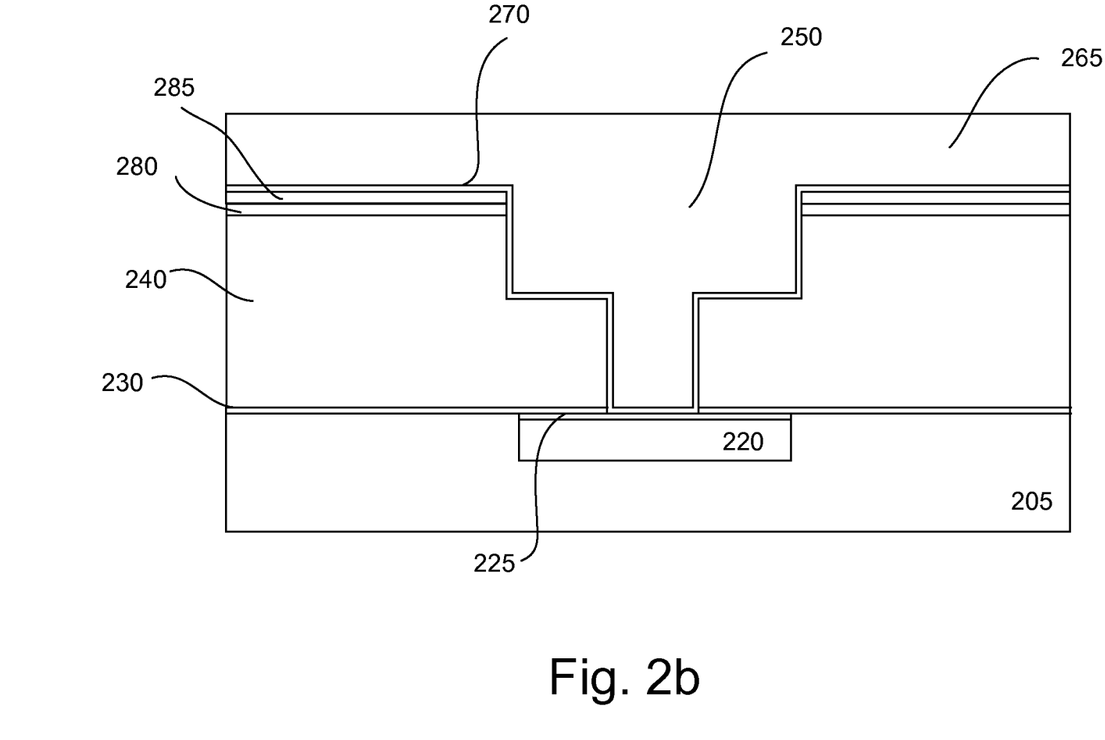

Referring to FIG. 2b, the dielectric layer is patterned to form an opening 250. The opening exposes a contact region 220 below the ICD layer. Depending on the ICD level, the contact region can be, for example, another metal line or a device region, such as a diffusion region or a gate of a transistor or a plate of a capacitor. A capping layer 225 can be provided over the metal line to passivate the metal line. The capping layer may comprise CoWP or CuSiN. Other types of capping materials are also useful. To pattern the dielectric layer, mask and etch techniques can be employed. For example, a soft mask, such as photoresist, can be used. The photoresist, for example, can be formed by various techniques, such as spin-on. Other techniques are also useful. The thickness of the soft sub-mask layer is, for example, about 50-5000 Å. Other thicknesses are also useful. An anti-reflective coating (ARC) can be formed beneath the soft sub-mask layer. The ARC, for example, comprises organic materials with carbon chains. Other types of ARC layers are also useful.

The soft mask layer is selectively exposed and developed to create the desired pattern. The pattern of the soft sub-mask is transferred to the other layers by, for example, an anisotropic etch, such as reactive ion etching (RIE). Other techniques for patterning the dielectric are also useful. The opening 250, as shown in FIG. 2b, comprises a dual damascene opening having a trench in the upper or IMD portion and a via opening in the lower or ILD portion. The dual damascene opening can be formed using various techniques. For example, the dual damascene opening can be formed using via first or via last techniques. Alternatively, the opening can be a damascene opening. For example, the damascene opening can be a via or trench opening. As shown, the opening comprises vertical sidewalls. Providing openings with slanted sidewalls may also be useful. For example, the sidewalls can have an angle of about 85-89°. Other sidewall angles may also be useful. The opening should be sufficiently deep to enable contact to the contact region below the dielectric layer.

After forming the opening, the photoresist or soft mask layer is removed. The soft mask is removed by, for example, ashing. Other techniques for removing the soft sub-mask are also useful.

In one embodiment, a barrier 270 is deposited on the substrate, lining the surface of the hard mask and opening. The barrier, for example, can comprise TaN, Ta, TiN or a combination thereof. Other type of barrier material, such as ruthenium, is also useful. Providing a barrier layer having multiple layers is also useful. The barrier can be formed by, for example, PVD, CVD or atomic layer deposition (ALD). Other techniques for forming the barrier are also useful.

A conductive layer 265 is deposited on the substrate covering the barrier and filling the dual damascene structure. The conductive material, for example, comprises copper, aluminum, tungsten, alloys such as Al doped Cu, Mn doped Cu, or a combination thereof. Other types of conductive materials, including metals and alloys, are also useful. In one embodiment, the conductive material comprises copper. A copper seed layer (not shown) may be first formed over the liner layer by, for example, PVD. The conductive material can be deposited by electro-plating. Other techniques, such as electro-less plating, CVD, PVD or sputtering, are also useful. The technique employed may depend on the material used.

Figure 2C:
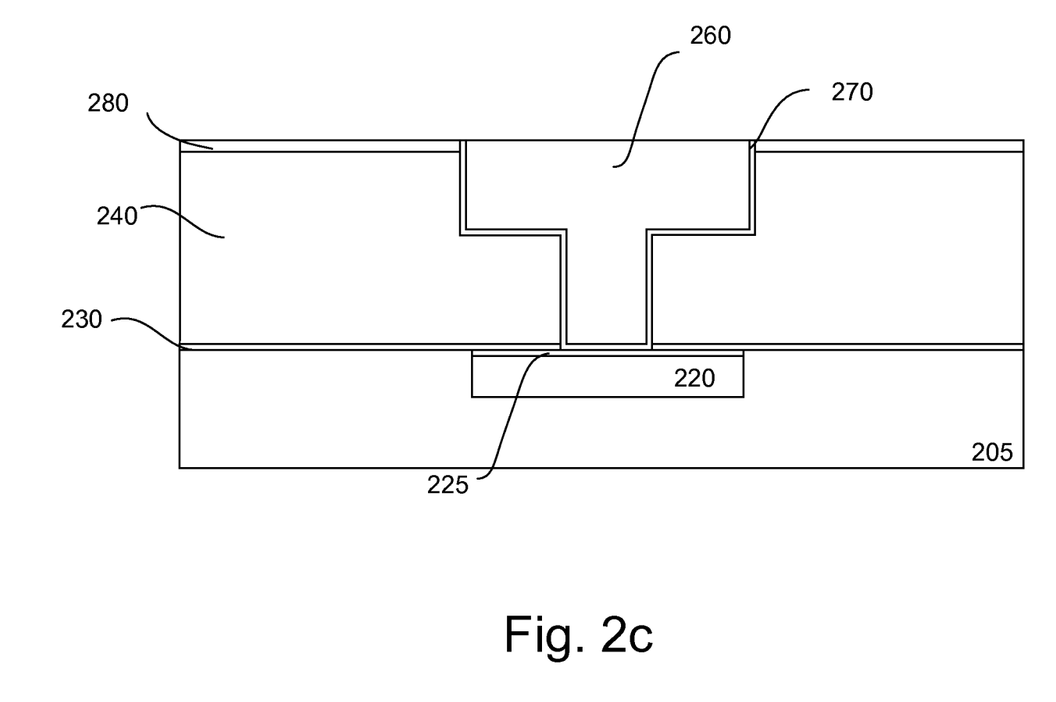

Referring to FIG. 2c, excess conductive material is removed to form an interconnect 260. In one embodiment, the excess material is removed by a planarizing process. The planarizing process removes excess conductive material, liner layer and hard mask over the dielectric layer. This results in the top surface of the conductive material being planar with the top surface of the sacrificial layer. The planarizing process comprises, for example, a polishing process, such as chemical mechanical polishing (CMP), electro-CMP (eCMP) or a combination thereof. Other types of planarizing or polishing processes are also useful. The polishing process may include multiple polishing steps to remove the different materials, such as the conductive, barrier and hard mask materials.

Figure 2D:
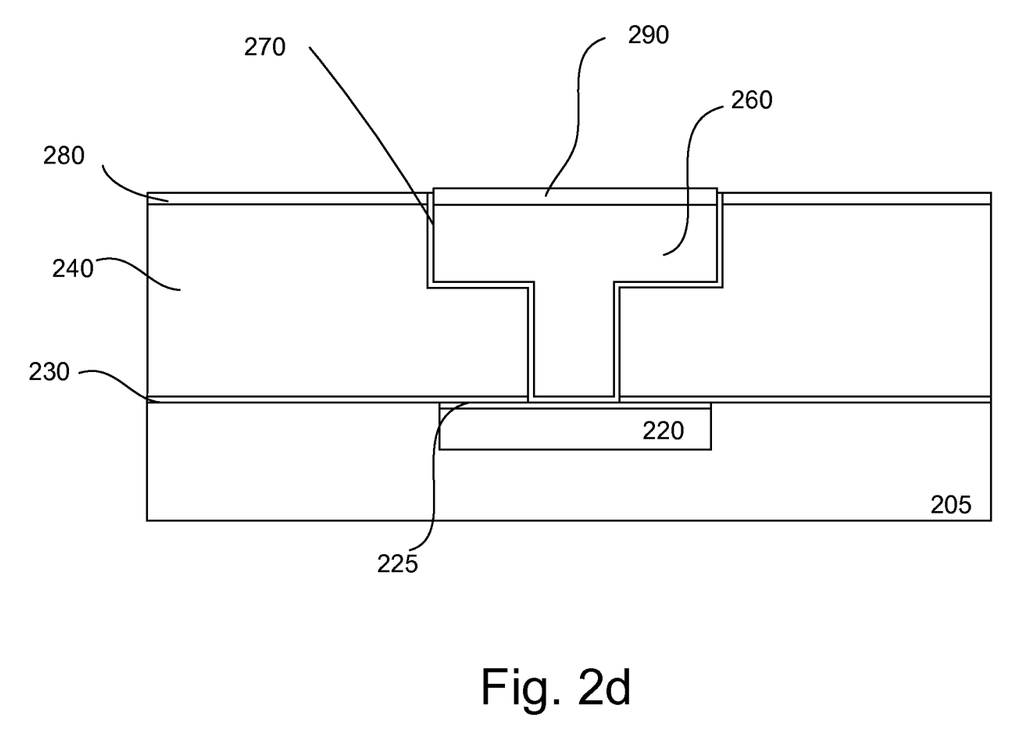

As shown in FIG. 2d, a protective capping layer 290 is formed over the conductive layer. The protective capping layer, in one embodiment, comprises a conductive capping layer. In one embodiment, the capping layer is selectively formed over the conductive layer. For example, the capping layer can be formed by electroless plating. Other techniques can also be used to form the capping layer. The capping layer may comprise CoWP. Other types of capping layers may also be useful. The thickness of the capping layer can be about 10-1000 Å. Other thicknesses are also useful.

Figure 2E:
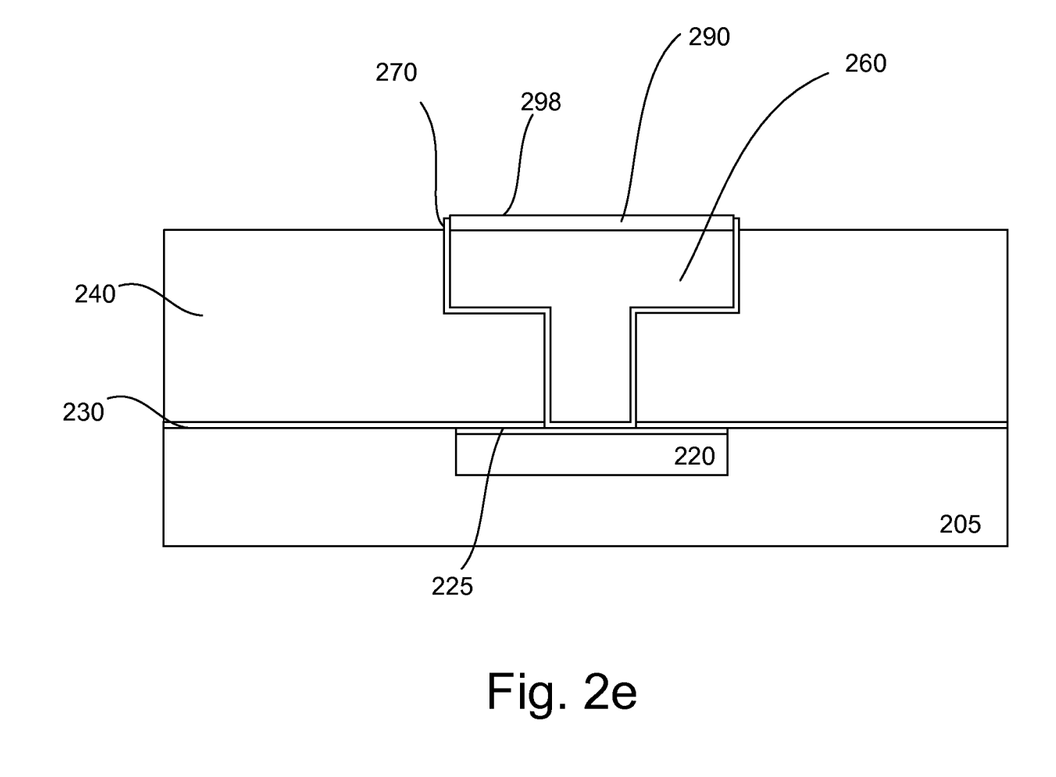

Referring to FIG. 2e, the sacrificial layer is removed. In one embodiment, removal comprises decomposing the sacrificial layer. The decomposing process comprises a non-etch or polishing process. In one embodiment, the decomposing process comprises a decomposing anneal. The decomposing anneal is conducted at a temperature equal to or greater than TDTT. The decomposable threshold temperature, for example, may be about 100-500° C. Other $T_{DTT}$ may also be useful. The decomposing anneal can include a reducing ambient. The magnitude of $T_{DTT}$ and annealing ambient may depend on, for example, the type of sacrificial layer employed. In another embodiment, carbon may be decomposed by an anneal, for example, at about 450° C. while polynorbornene may be removed at about 425° C.

By removing the sacrificial layer without using an etch or polishing process, damage to the dielectric layer by such processes is avoided.

As shown, the top surface of the ICD layer is disposed or recessed below a top surface 298 of the protective capping layer 290. The height of the recess, for example, is about 50-300 Å. Providing the top surface of the ICD layer which is not recessed is also useful. For example, the top surface of the ICD layer can be coplanar or above the top surface of the capping layer.

Figure 2F:
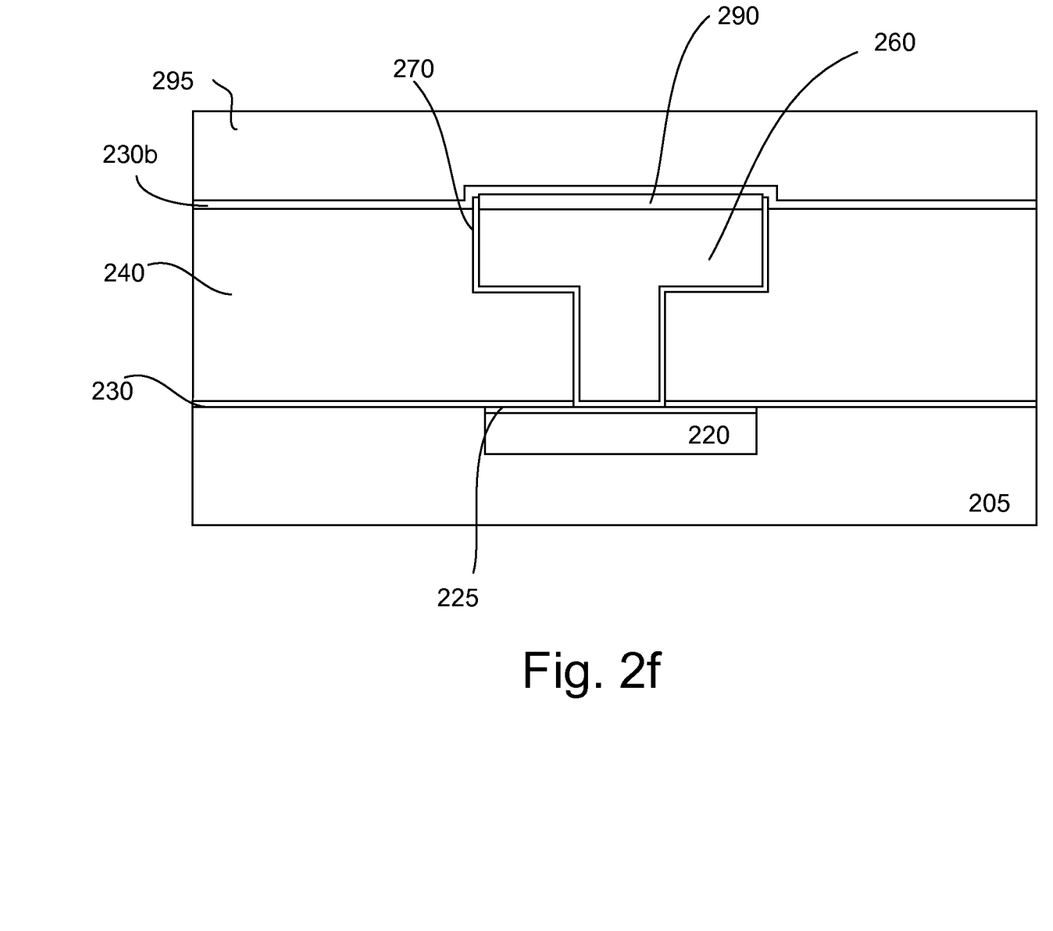

In one embodiment, as shown in FIG. 2f, an upper dielectric layer 295 may be deposited on the substrate. The upper dielectric layer covers the dielectric layer and conductive layer. The upper dielectric layer, for example, may serve as another ICD layer in which interconnects are formed. An etch stop layer 230b may be formed prior to forming the upper dielectric layer. The etch stop layer can include various types of materials. In one embodiment, the etch stop layer comprises a dielectric material such as silicon nitride. Other types of dielectric etch stop materials may also be useful. For example, the etch stop layer may comprise silicon carbide. The etch stop layer may also serve as a capping layer.

The process continues to form the IC. For example, additional interconnect levels can be formed. The interconnect levels can be formed similar to the process described in FIGS. 2d-2f. Further processing can include final passivation, dicing, assembly and packaging. Other processes are also useful.

Figure 3:
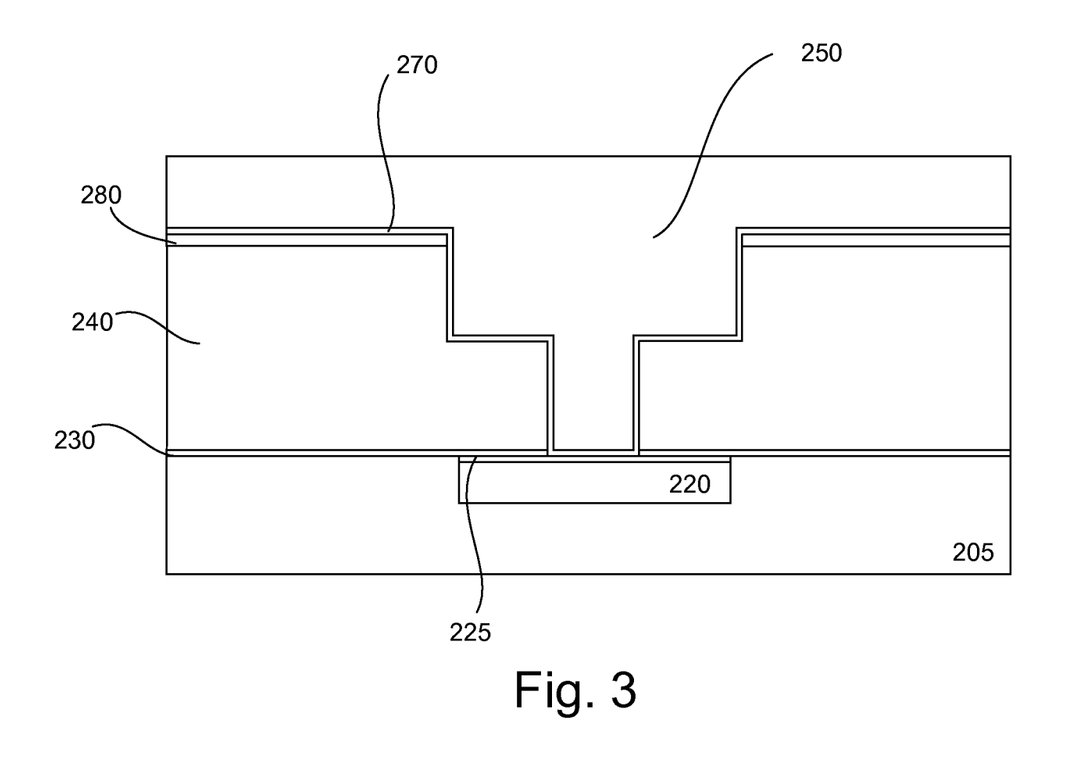
FIG. 3 shows another embodiment of a process for forming a portion of an IC.

In another embodiment, as shown in FIG. 3, the hard mask is removed after forming the opening. This leaves the sacrificial layer covering the surface of the ICD layer. The hard mask layer, in one embodiment, can be removed using plasma etching process. In other embodiments, other techniques for removing the hard mask layer can also be used. After removal of the hard mask layer, the process continues as described from FIGS. 2b-f to form the interconnect and IC.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor device comprising:
a substrate;
a lower dielectric layer on the substrate, wherein the lower dielectric layer comprises at least an interconnect region and a non-interconnect region adjacent to the interconnect region, wherein the interconnect region of the lower dielectric layer comprises an interconnect disposed therein while the non-interconnect region of the lower dielectric layer is devoid of an interconnect and comprises an unetched or unpolished top surface having hydrophobic characteristics;
an etch stop layer disposed on and contacting the unetched or unpolished top surface of the non-interconnect region of the lower dielectric layer, wherein the same etch stop layer is also disposed over and contacts a top surface of the interconnect; and
an upper dielectric layer disposed on the etch stop layer.

2. The semiconductor device of claim 1 wherein the lower dielectric layer comprises low k or ultra low k dielectric material.

3. The semiconductor device of claim 2 wherein the lower dielectric layer comprises organo-silicate glass (OSG), fluorine-doped silicate glass (FSG), SiCOH, silicon oxide, doped silicon oxide, undoped or doped silicate glasses, undoped or doped thermally grown silicon oxide, or undoped or doped TEOS deposited silicon oxide.

4. The semiconductor device of claim 1 wherein the interconnect comprises a dual damascene structure having a conductive line disposed in an upper portion of the lower dielectric layer and a contact disposed in a lower portion of the lower dielectric layer.

5. The semiconductor device of claim 4 wherein the contact couples the conductive line to a contact region below the interconnect.

6. The semiconductor device of claim 5 wherein the contact region comprises another conductive line or a device region which includes a diffusion region or a gate of a transistor or a plate of a capacitor.

7. The semiconductor device of claim 1 wherein the interconnect comprises a damascene structure having a via contact disposed within the lower dielectric layer.

8. The semiconductor device of claim 1 wherein the top surface of the lower dielectric layer is below a top surface of the interconnect.

9. The semiconductor device of claim 1 wherein the interconnect comprises a protective capping layer over a top surface of the interconnect.

10. The semiconductor device of claim 9 wherein the capping layer is a conductive capping layer.

11. The semiconductor device of claim 10 wherein the conductive capping layer comprises CoWP.

12. The semiconductor device of claim 9 wherein the top surface of the non-interconnect region of the lower dielectric layer is disposed below a top surface of the capping layer.

13. The semiconductor device of claim 1 wherein the etch stop layer comprises silicon nitride.

14. A semiconductor device comprising:
a substrate;
a lower dielectric layer on the substrate, wherein the lower dielectric layer comprises at least an interconnect region and a non-interconnect region adjacent to the interconnect region, wherein the interconnect region of the lower dielectric layer comprises an interconnect disposed therein while the non-interconnect region of the lower dielectric layer is devoid of an interconnect and comprises an unetched or unpolished top surface having hydrophobic characteristics; and
an upper dielectric layer disposed over and contacting the unetched or unpolished top surface of the non-interconnect region of the lower dielectric layer and wherein the same upper dielectric layer is also disposed over and contacts a top surface of the interconnect.

15. A semiconductor device comprising:
a substrate;
a lower dielectric layer on the substrate, wherein the lower dielectric layer comprises at least an interconnect region and a non-interconnect region adjacent to the interconnect region, wherein the interconnect region of the lower dielectric layer comprises an interconnect disposed therein while the non-interconnect region of the lower dielectric layer is devoid of an interconnect and comprises an unetched or unpolished top surface having hydrophobic characteristics;
an etch stop layer disposed on and contacting the unetched or unpolished top surface of the non-interconnect region of the lower dielectric layer, wherein the same etch stop layer is also disposed over and contacts a top surface of the interconnect.

16. The semiconductor device of claim 15 wherein the interconnect comprises a dual damascene structure having a conductive line disposed in an upper portion of the lower dielectric layer and a contact disposed in a lower portion of the lower dielectric layer.

17. The semiconductor device of claim 16 wherein the contact couples the conductive line to a contact region below the interconnect.

18. The semiconductor device of claim 17 wherein the contact region comprises another conductive line or a device region which includes a diffusion region or a gate of a transistor or a plate of a capacitor.

19. The semiconductor device of claim 15 wherein the interconnect comprises a damascene structure having a via contact disposed within the lower dielectric layer.

20. The semiconductor device of claim 15 wherein the interconnect comprises a protective capping layer over a top surface of the interconnect.

* * * * *